United States Patent
Onoda et al.

(10) Patent No.: US 10,859,225 B2
(45) Date of Patent: Dec. 8, 2020

(54) VEHICLE LAMP HAVING CAN-TYPE LASER AND HEAT SINK

(71) Applicant: Koito Manufacturing Co., Ltd., Tokyo (JP)

(72) Inventors: Yukihiro Onoda, Shizuoka (JP); Tsukasa Tokida, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 55 days.

(21) Appl. No.: 16/123,024

(22) Filed: Sep. 6, 2018

(65) Prior Publication Data
US 2019/0086049 A1    Mar. 21, 2019

(30) Foreign Application Priority Data

Sep. 19, 2017 (JP) .................................. 2017-178659

(51) Int. Cl.
| | |
|---|---|
| *H01S 5/022* | (2006.01) |
| *F21S 41/16* | (2018.01) |
| *F21V 19/00* | (2006.01) |
| *F21V 29/70* | (2015.01) |
| *H01S 5/06* | (2006.01) |
| *F21S 45/48* | (2018.01) |
| *F21V 29/76* | (2015.01) |
| *H01S 5/024* | (2006.01) |
| *H01S 5/00* | (2006.01) |
| *F21Y 115/30* | (2016.01) |
| *H01S 5/02* | (2006.01) |

(52) U.S. Cl.
CPC ............... *F21S 41/16* (2018.01); *F21S 45/48* (2018.01); *F21V 19/003* (2013.01); *F21V 19/0055* (2013.01); *F21V 29/70* (2015.01); *F21V 29/763* (2015.01); *H01S 5/005* (2013.01); *H01S 5/02469* (2013.01); *H01S 5/0609* (2013.01); *F21Y 2115/30* (2016.08); *H01S 5/02* (2013.01); *H01S 5/02212* (2013.01); *H01S 5/02296* (2013.01)

(58) Field of Classification Search
CPC ........ F21V 19/002; F21V 19/004; F21K 9/00; H01L 33/64; H01S 5/02212; H05K 1/0203; H05K 1/0209
USPC ................................. 174/548, 252; 165/80.3
See application file for complete search history.

(56) References Cited

U.S. PATENT DOCUMENTS

| | | | | |
|---|---|---|---|---|
| 2,917,286 | A * | 12/1959 | Deakin | H01L 23/4006 165/80.3 |
| 3,849,838 | A * | 11/1974 | Hehl | F16B 2/24 24/305 |
| 6,079,486 | A * | 6/2000 | Cennamo | H01L 23/4093 165/185 |

(Continued)

FOREIGN PATENT DOCUMENTS

JP    2006-278361 A    10/2006

*Primary Examiner* — Ismael Negron
(74) *Attorney, Agent, or Firm* — Abelman, Frayne & Schwab

(57) ABSTRACT

A lamp unit includes: a laser light source having a CAN type package; a pedestal having a back surface in contact with a heat sink and a front surface on which the laser light source is mounted; and a pressing member that abuts onto an abutting portion of the laser light source and presses the laser light source in a direction toward the pedestal. The pressing member and the pedestal are fixed to the heat sink by fastening with a common fixing member.

8 Claims, 5 Drawing Sheets

(56) References Cited

U.S. PATENT DOCUMENTS

| | | | | |
|---|---|---|---|---|
| 6,209,623 B1* | 4/2001 | Tantoush | ............ | H01L 23/4006 165/80.3 |
| 6,582,100 B1* | 6/2003 | Hochstein | ............. | F21V 19/004 362/294 |
| 6,922,338 B2* | 7/2005 | Poechmueller | ........ | G11C 5/005 165/80.3 |
| 7,206,204 B2* | 4/2007 | Nakatsu | ............. | H01L 23/4006 165/80.3 |
| 7,255,463 B2* | 8/2007 | Wang | ........................ | F21K 9/00 362/373 |
| 7,281,818 B2* | 10/2007 | You | ....................... | F21V 7/0083 257/88 |
| 7,531,846 B2* | 5/2009 | Huang | ................. | H01L 33/647 257/100 |
| 7,674,012 B1* | 3/2010 | Lin | ....................... | F21V 29/717 362/249.02 |
| 7,936,561 B1* | 5/2011 | Lin | .................... | F21V 19/0055 165/185 |
| 8,536,768 B2* | 9/2013 | Van Gennip | .............. | F21K 9/00 313/46 |
| 8,643,271 B2* | 2/2014 | Shimonishi | ............... | F21K 9/00 313/46 |
| 9,091,399 B2* | 7/2015 | Farmer | ............... | E04B 1/34321 |
| 9,091,421 B2* | 7/2015 | Kim | ..................... | H05K 1/0203 |
| 9,249,955 B2* | 2/2016 | Schroll | ................. | F21V 29/507 |
| 9,562,548 B2* | 2/2017 | Breidenassel | ............ | F21V 7/00 |
| 10,218,148 B2* | 2/2019 | Sugiyama | ............ | H01S 5/0078 |
| 2004/0218366 A1* | 11/2004 | Speigl | ................. | H05K 1/0206 361/720 |
| 2005/0146884 A1* | 7/2005 | Scheithauer | ............ | F21S 45/47 362/470 |
| 2008/0303050 A1* | 12/2008 | Lin | ......................... | F21V 29/71 257/99 |
| 2009/0002996 A1* | 1/2009 | Wu | ...................... | F21V 29/004 362/294 |
| 2012/0175664 A1* | 7/2012 | Lin | ........................... | F21K 9/90 257/99 |

\* cited by examiner

A-A

B-B

110

VEHICLE LAMP HAVING CAN-TYPE LASER AND HEAT SINK

CROSS-REFERENCE TO RELATED APPLICATIONS

This application is based on and claims priority from Japanese Patent Application No. 2017-178659, filed on Sep. 19, 2017 with the Japan Patent Office, the disclosure of which is incorporated herein in its entirety by reference.

TECHNICAL FIELD

The present disclosure relates to a lamp unit and a vehicle lamp.

BACKGROUND

In the related art, as a light source of a vehicle lamp, a semiconductor light emitting element such as a light emitting diode (LED) or a semiconductor laser has been proposed. In such a semiconductor light emitting element, it is important to satisfactorily radiate heat generated with light emitting.

As a laser light source in the related art, a light source module has been known, in which a laser light source of a CAN type package having a laser element and a metallic stem on which the laser element is mounted is mounted on a circuit board (see, e.g., Japanese Laid-open Patent Publication No. 2006-278361). In the light source module, the laser light source is connected to the circuit board in a state where the laser light source is press-fitted into a hole of a metallic heat radiating plate. A side surface of the stem and a side surface of the hole of the heat radiating plate are brought into contact with each other, and heat from the laser light source is transmitted from the side surface of the stem to the heat radiating plate. However, in a case where the laser light source is used as a light source of a vehicle lamp, it is not sufficient to radiate heat from the side surface of the stem alone. Thus, a lamp unit that has a structure aimed at further improving the heat radiation property has been proposed.

FIG. 10 is a cross-sectional view schematically illustrating a structure of a vehicle lamp using a CAN type package in the related art. As illustrated in FIG. 10, in a vehicle lamp in the related art, a metallic pedestal having a good thermal conductivity includes an insertion hole 2 which is opened therein, and a laser light source 3 of the CAN type package is mounted on the pedestal 1 by inserting power supply terminals 4 into the insertion hole 2 from a front surface side of the pedestal 1. The power supply terminals 4 are provided on a back surface side of the pedestal 1 and electrically connected to a circuit board 5 by soldering. The circuit board 5 is fixed to the back surface of the pedestal 1 by fixing screws 6. Further, adhesive 7 is applied between the laser light source 3 and the pedestal 1. A heat sink and heat radiation fins (not illustrated) are further provided on the back surface side of the pedestal 1.

In the related art illustrated in FIG. 10, a back surface of the stem of the laser light source 3 of the CAN type package and the pedestal 1 are in surface-contact with each other via the adhesive 7. Thus, the heat generated by light emitting of the laser element is satisfactorily radiated from the heat sink and the heat radiation fins from the back surface of the stem of the CAN type package via the pedestal 1.

SUMMARY

However, in the related art illustrated in FIG. 10, the laser light source 3 and the pedestal 1 are fixed to each other only by the adhesive 7. Thus, in a case where the adhesive 7 is deteriorated by, for example, the influence of heat or vibration so that the adhesive power is decreased, there is a possibility that the positional deviation occurs in the laser light source 3 and an optical axis is shifted with respect to the optical system. When an optical axis of the laser light source 3 is shifted, glare may occur in distribution characteristics irradiated from a vehicle lamp. Thus, it is required to enhance reliability by improving the fixing structure between the laser light source 3 and the pedestal 1. It is effective to increase an amount of the adhesive applied in order to suppress the decrease of the adhesive power due to the deterioration of the adhesive 7. However, since the thermal conductivity from the laser light source 3 to the pedestal 1 is decreased, there is a limit to the applied amount.

Thus, an object of the present disclosure is to provide a lamp unit and a vehicle lamp that is able to fix the laser light source of the CAN type package while simultaneously achieving a good heat radiating property and a high reliability.

In order to solve the above-described problems, a lamp unit of the present disclosure includes: a laser light source having a CAN type package; a pedestal having a back surface in contact with a heat sink and a front surface on which the laser light source is mounted; and a pressing member that abuts on an abutting portion of the laser light source and presses the laser light source in a direction toward the pedestal. The pressing member and the pedestal are fixed to the heat sink by fastening with a common fixing member.

In such a lamp unit of the present disclosure, it is possible to fix the laser light source of the CAN type package while achieving a good heat radiating property and a high reliability, by pressing the laser light source in a direction toward the pedestal with a pressing member and fixing the pressing member and pedestal to a heat sink by joint fastening with a common fixing member.

Further, in an aspect of the present disclosure, the pressing member is made of a material having a thermal conductivity of 150 to 410 W/m·K.

Further, in an aspect of the present disclosure, the abutting portion is a flange portion in the CAN type package.

Further, in an aspect of the present disclosure, the pressing member is brought into contact with the laser light source in the vicinity of a wavelength converting member.

Further, in an aspect of the present disclosure, the pressing member includes a heat radiating portion that transmits heat to the pedestal, and a heat conducting member is sandwiched between the heat radiating portion and the pedestal.

Further, in order to solve the above-described problems, a vehicle lamp of the present disclosure includes the lamp unit described above.

In such a vehicle lamp of the present disclosure, it is possible to fix the laser light source of the CAN type package while achieving a good heat radiating property and a high reliability, by pressing the laser light source in a direction toward the pedestal with a pressing member and fixing both the pressing member and pedestal to a heat sink by fastening with a common fixing member.

In the present disclosure, it is possible to provide a lamp unit and a vehicle lamp that is able to fix the laser light source of the CAN type package while simultaneously achieving a good heat radiating property and a high reliability.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

First Embodiment

Figure 1:
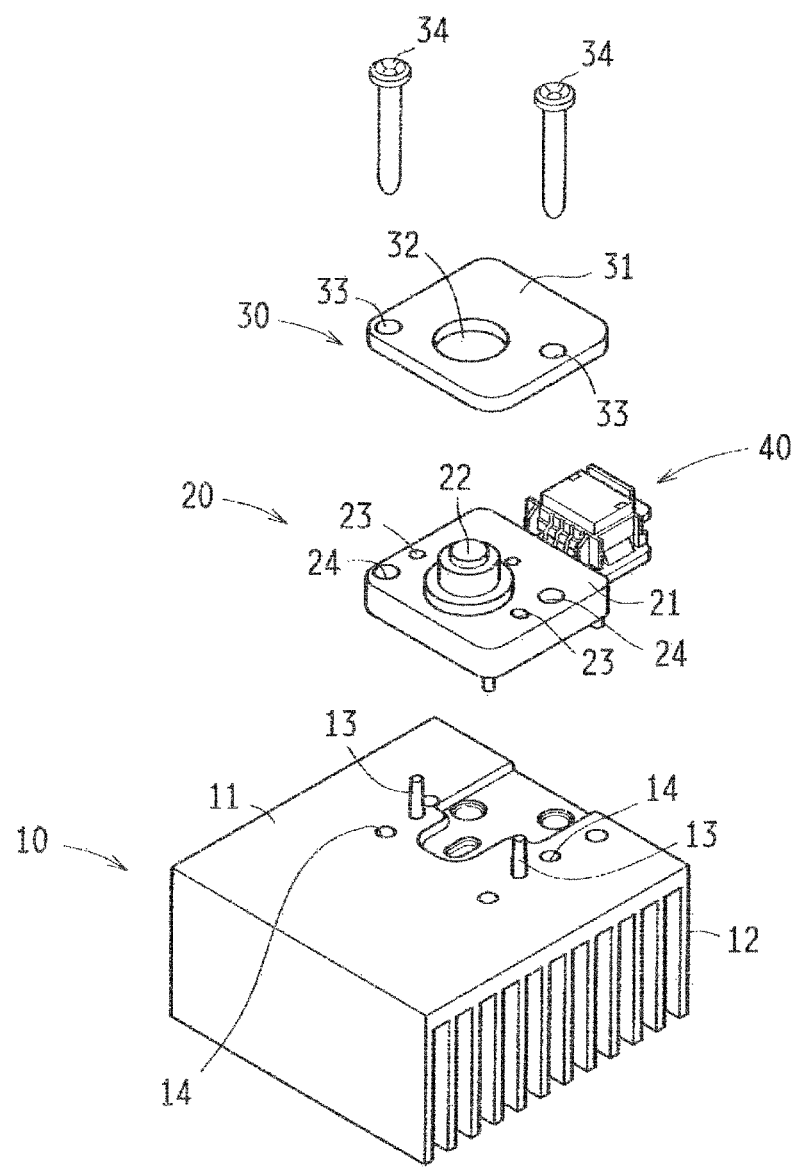
FIG. 1 is an exploded perspective view schematically illustrating a lamp unit 100 of a first embodiment.

Hereinafter, embodiments of the present disclosure will be described in detail with reference to the drawings. Identical or corresponding components, members, and processes in each of the drawings will be denoted by the same symbols, and overlapping descriptions thereof will be appropriately omitted. FIG. 1 is an exploded perspective view schematically illustrating a lamp unit 100 of the present embodiment. As illustrated in FIG. 1, the lamp unit 100 includes a heat sink 10, a light source unit 20, a pressing member 30, and a driving unit 40.

The heat sink 10 is a heat radiating member made of a material having a good thermal conductivity, and includes a heat sink body 11, heat radiation fins 12, positioning pins 13, and fixing holes 14. Examples of a material that constitutes the heat sink 10 include a metal such as copper or aluminum, an aluminum die cast, and a resin molded product containing thermally conductive particles.

The light source unit 20 is a member that is electrically connected to the driving unit 40 and emits light based on power and signals supplied from the driving unit 40, and includes a pedestal 21, a laser light source 22, positioning holes 23, and fixing through holes 24.

The pressing member 30 is a substantially flat plate-like member made of a material having a good thermal conductivity, and includes a flat plate portion 31, a light source exposure opening portion 32, fixing through holes 33, and fixing members 34. Examples of a material that constitutes the pressing member 30 include a metal such as copper or aluminum, an aluminum die cast, and a resin molded product containing thermally conductive particles. The pressing member 30 may be made of a material having a thermal conductivity of 150 to 410 W/m·K because the pressing member 30 functions as a heat radiating path from the laser light source 22 as described later. Here, although the pressing member 30 is illustrated as a substantially flat plate-like shape, the shape is not limited thereto as long as the pressing member 30 can press the laser light source 22 in a direction toward the pedestal 21 by abutting onto the pedestal 21.

The driving unit 40 is a member that includes a circuit which is supplied with power and signals via, for example, harness connected from the outside of the lamp unit 100 and supplies a current for driving the laser light source 22 of the light source unit 20. Here, although descriptions have been made on an example in which the driving unit includes the circuit of the laser light source 22 and is disposed adjacent to the light source unit 20, the driving unit 40 and the light source unit 20 may be separated from each other and connected via a harness or a flexible printed circuit (FPC).

The heat sink body 11 is a plate-like portion provided with each part of the heat sink 10 and having a substantially flat surface and a predetermined thickness. On the front surface side of the heat sink body 11, the positioning pins 13 are erected at positions corresponding to the positioning holes 23, and fixing holes 14 are formed at positions corresponding to the fixing through holes 24. Further, on the back surface side of the heat sink body 11, a plurality of heat radiation fins are integrally formed with the heat sink body 11.

The heat radiation fins 12 are a plurality of substantially plate-like portions erected on the back surface side of the heat sink body 11, and integrally formed with the heat sink body 11. Although FIG. 1 illustrates an example in which a plurality of substantially plate-like heat radiation fins 12 are provided substantially in parallel with each other, the shape is not limited thereto. Rod-shaped heat radiation fins 12 may be disposed two-dimensionally, or any known technique may be used, for example, to roughen surfaces of the heat radiation fins 12, thereby forming fine irregularities.

The positioning pins 13 are members that are erected on the front surface side of the heat sink body 11, and are formed at positions and in a shape corresponding to the positioning holes 23 on the light source unit 20 side. The positioning pins 13 may be integrally formed with the heat sink body 11, or separate pins may be inserted into holes formed in the heat sink body 11 such that the upper portions of the pins are exposed.

The fixing holes 14 are holes that are formed on the front surface side of the heat sink body 11 and into which tips of the fixing members 34 are inserted, and are formed at positions and in a shape corresponding to the fixing through holes 24 of the light source unit 20 and the fixing through holes 33 of the pressing member 30. The fixing holes 14 have a structure capable of fixing the light source unit 20 and the pressing member 30 by inserting the fixing members 34. For example, in a case where a screw is used as the fixing member 34, a thread groove of corresponding pitch is formed in the inner walls of the fixing holes 14.

The pedestal 21 is a substantially flat plate-like member made of a material having a good thermal conductivity, and is provided with the positioning holes 23 and the fixing through holes 24. Further, as described later in FIG. 3, the pedestal 21 is provided with a lead insertion hole 26. The laser light source 22 is mounted on the front surface side of the pedestal 21, and the back surface side thereof is brought into contact with the heat sink 10. Examples of a material that constitutes the pedestal 21 include a metal such as copper or aluminum, an aluminum die cast, and a resin molded product containing thermally conductive particles.

The laser light source 22 is mounted on the front surface of the pedestal 21 and is electrically connected with the driving unit 40 at the back surface side, and irradiates light of a predetermined wavelength according to the current supplied from the driving unit 40. As illustrated in FIG. 1, the laser light source 22 includes a CAN type package known in the related art and is provided with a stem, a laser element, and a wavelength converting member inside the CAN type package. A wave length of light emitted from the laser light source 22 may be a single color of each of RGB, white obtained by mixing respective colors of RGB, or white obtained by mixing a first light emitted by the laser element and a second light wavelength-converted by the wavelength converting member.

The positioning holes 23 are holes that penetrate the pedestal 21 from the front surface side to the back surface side, and are formed at positions and in a shape corresponding to the positioning pins 13 of the heat sink 10. When the positioning pins 13 are inserted into the positioning holes 23, the light source unit 20 is positioned with respect to the heat sink 10, and the position of the laser light source 22 in the lamp unit 100 is determined. Here, descriptions have been made on an example in which the positioning holes 23 penetrate the pedestal 21 from the front surface side to the back surface side. However, it is possible to appropriately design the positioning holes according to a shape and a length of the positioning pins 13. For example, a recessed portion may be formed on the back surface side of the pedestal 21 with a predetermined depth.

The fixing through holes 23 are holes that penetrate the pedestal 21 from the front surface side to the back surface side, and are formed at positions and in a shape corresponding to the fixing holes 14 of the heat sink 10 and the fixing through holes of the pressing member 30.

The flat plate portion 31 is a body portion of the pressing member 30 which has a substantially flat plate shape, and is provided with the light source exposure opening portion 32 and the fixing through holes 33. As described above, the pressing member 30 is a member made of a material having a good thermal conductivity, and examples of a material that constitutes the flat plate portion 31 include a metal such as copper or aluminum, an aluminum die cast, and a resin molded product containing thermally conductive particles. Here, although the flat plate portion 31 is illustrated as a substantially flat plate shape, the shape is not limited thereto as long as the pressing member 30 can press the laser light source 22 in a direction toward the pedestal 21 by abutting onto the pedestal 21.

Figure 3:
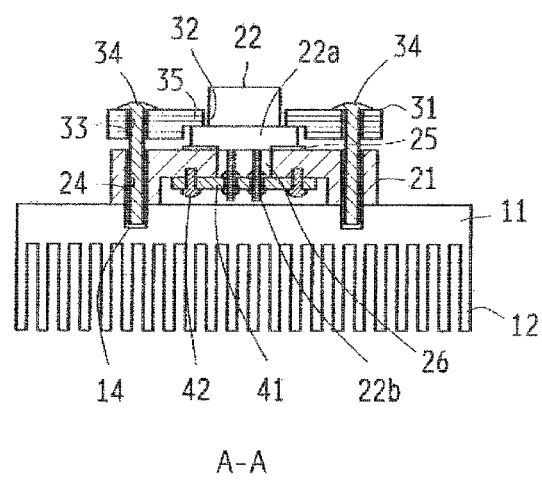
FIG. 3 is a cross-sectional view schematically illustrating a structure of the lamp unit 100 of the first embodiment and taken along a line A-A in FIG. 2.

The light source exposure opening portion 32 is a hole that penetrates the flat plate portion 31 from the front surface side to the back surface side. A light emitting portion of the laser light source 22 is exposed from the light source exposure opening portion 32, light from the laser light source 22 is taken out to the outside of the lamp unit 100. A diameter of the light source exposure opening portion 32 may be set to such an extent that the light emitting portion of the laser light source 22 is exposed. However, in the example illustrated in FIG. 1, the diameter of the light source exposure opening portion 32 is set to such an extent that a cylindrical portion of the laser light source 22 is capable of being inserted into the light source exposure opening portion but a flange portion 22a illustrated in FIG. 3 is not capable of being inserted thereinto.

The fixing through holes 33 are holes that penetrate the flat plate portion 31 from the front surface side to the back surface side, and are formed at positions and in a shape corresponding to the fixing holes 14 of the heat sink 10 and the fixing through holes of the light source unit 20.

The fixing members 34 are members that are inserted into the fixing through holes 33 and the fixing through holes 24, and at the same time, are inserted into and fixed in the fixing holes 14. The structure for fixing the fixing members 34 in the fixing holes 14 is not limited, but, for example, in a case where screw grooves are formed in the fixing holes 14, screws may be used as the fixing members 34. Further, as described later, the fixing members 34 function as heat radiating paths from the laser light source 22. Thus, the fixing members 34 may be made of a material having a good thermal conductivity.

Figure 2:
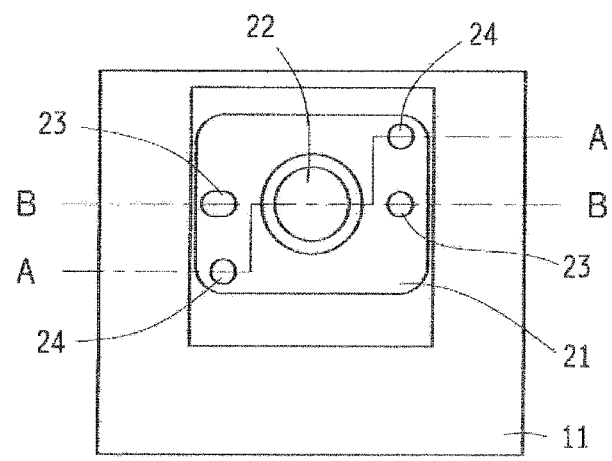
FIG. 2 is a plan view schematically illustrating a pedestal 21 of the first embodiment.

FIG. 2 is a plan view schematically illustrating the pedestal 21 of the present embodiment. As illustrated in FIG. 2, the pedestal 21 is mounted on the heat sink body 11, is provided with two positioning holes 23 with laser light source 22 interposed therebetween, and is provided with two fixing through holes 24 which are disposed diagonally with laser light source 22 interposed therebetween. A line A-A in the drawing indicates a position of a cross-section that transverses the fixing through holes 24 and the laser light source 22, and a line B-B in the drawing indicates a position of a cross-section that transverses the positioning holes 23 and the laser light source 22.

Figure 4:
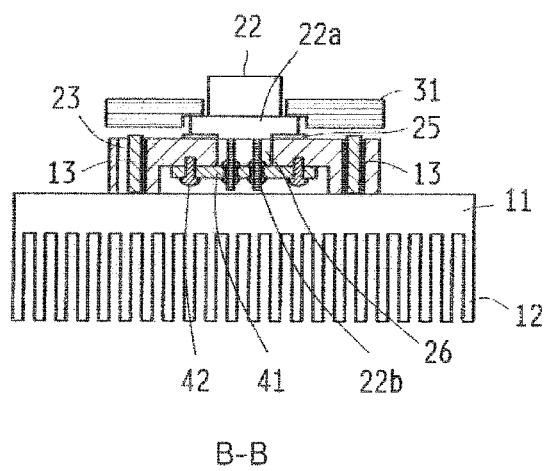
FIG. 4 is a cross-sectional view schematically illustrating a structure of the lamp unit 100 of the first embodiment and taken along a line B-B in FIG. 2.

Next, an assembled state of the lamp unit 100 will be described in detail with reference to FIGS. 3 and 4. FIG. 3 is a cross-sectional view schematically illustrating a structure of the lamp unit 100 of the present embodiment and taken along a line A-A in FIG. 2. FIG. 4 is a cross-sectional view schematically illustrating a structure of the lamp unit 100 of the present embodiment and taken along a line B-B in FIG. 2.

As illustrated in FIGS. 3 and 4, the pedestal 21 is mounted on the heat sink body 11, and when the positioning pins 13 are inserted into the positioning holes 23, the position of the pedestal 21 on the heat sink body 11 is determined. The flat plate portion 31 of the pressing member 30 is disposed above the pedestal 21, and the fixing members 34 are inserted through the fixing holes 14 and the fixing through holes 24 such that the tips of the fixing members 34 are fixed in the fixing holes 14. Therefore, the pedestal 21 and the flat plate portion 31 are fixed to the heat sink body 11 by joint fastening.

As illustrated in FIGS. 3 and 4, a periphery of the light source exposure opening portion 32 is formed to be thin to form an opening peripheral portion 35, and the opening peripheral portion 35 abuts onto the upper surface of the flange portion 22a of the laser light source 22. Here, the flange portion 22a that abuts onto the opening peripheral portion 35 corresponds to an abutting portion in the present disclosure.

As illustrated in the drawings, the opening peripheral portion 35 is formed to be thin to form a recessed portion on the back surface of the flat plate portion 31, but the depth of the recessed portion is lower than the height of the flange portion 22a. Accordingly, even when the back surface side of the opening peripheral portion 35 abuts onto the upper surface of the flange portion 22a, the back surface of the flat plate portion 31 is not interfered with the pedestal 21. Further, the cylindrical portion of the laser light source 22 is inserted into the light source exposure opening portion 32 of the flat plate portion 31, and the cylindrical portion and the light emitting portion of the laser light source 22 protrude above the flat plate portion 31.

Further, the laser light source 22 is provided with lead terminals 22b that extend from the back surface of the flange portion 22a. The lead terminals 22b are inserted into lead insertion holes 26 formed in the pedestal 21. The lead terminals 22b protrude from the back surface of the pedestal 21. A wiring board 41 is extended from the driving unit 40 on the back surface side of the pedestal 21, and the lead terminals 22b are inserted into through holes in the wiring board 41 and soldered simultaneously so that the lead terminals 22b are electrically and mechanically connected to the wiring board 41. The wiring board 41 is disposed to be brought into contact with the back surface of the pedestal 21, and fixed by fixing members 42, for example, screws.

Therefore, the wiring board 41 is positioned and fixed to the pedestal 21 by the fixing members 42, the lead terminals 22b are positioned and fixed to the wiring board 41 by soldering, and the laser light source 22 is positioned and fixed at a predetermined position on the pedestal 21. Further, adhesive 25 is applied between the front surface of the pedestal 21 and the back surface of the flange portion 22a, and the pedestal 21 and the laser light source 22 are in surface-contact and fixed.

As described above, the laser light source 22 is fixed to the pedestal 21 with the adhesive 25, and at the same time, the opening peripheral portion 35 abuts onto the flange portion 22a. The pressing member 30 and the pedestal 21 are fastened together to the heat sink 10 by joint fastening with the fixing members 34. Thus, the opening peripheral portion 35 and the flange portion 22a are pressed in a direction toward the heat sink 10 by fastening with the fixing members 34. Therefore, in the lamp unit 100, the laser light source 22 is fixed to the pedestal 21 not only by fixing with the adhesive 25, but also by pressing by the pressing member 30. As a result, in a case where the adhesive 25 is deteriorated by vibration or heat, it is possible to suppress the optical axis from being shifted with respect to the optical system due to the generation of the positional deviation of the laser light source 22, thereby suppressing the generation of glare. Further, the amount of the adhesive 25 required to fix the laser light source 22 and the pedestal 21 may be reduced. Thus, heat conduction from the laser light source 22 to the pedestal 21 may be improved, so that high reliability and high heat radiating property may be achieved at the same time.

Further, in the lamp unit 100 of the present embodiment, the heat generated by light emitting of the laser light source 22 may be satisfactorily radiated from the heat sink 10 via two heat radiating paths described in the following. A first heat radiating path passes from the back surface of the flange portion 22a of the laser light source 22 via the pedestal 21, and passes the contact surface between the pedestal 21 and the heat sink body 11. A second heat radiating path passes from the upper surface of the flange portion 22a of the laser light source 22 via the opening peripheral portion 35, and reaches the heat sink body 11 via the flat plate portion 31, the fixing members 34, and the fixing holes 14.

Further, in order to improve the heat conductivity by the second heat radiating path described above, thermal conductive grease may be applied to the contact surface of each member in the heat radiating path. Specific application locations of the heat conductive grease may include, for example, a contact surface between the opening peripheral portion 35 and the flange portion 22a, a contact surface of a screw head back surface of the fixing member 34 and the peripheral portion of the fixing through hole 14, a contact surface between the fixing member 34 and an inside of the fixing hole 14, and a contact surface between the back surface of the pedestal section 21 and the heat sink body 11. In the present embodiment, the opening peripheral portion 35 is brought into contact with the upper surface of the flange portion 22a which is an abutting portion. Thus, the heat radiating property from the laser light source 22 may be improved by adding the second heat radiating path described above.

Further, by fastening the pedestal 21 and the pressing member 30 together to the heat sink 10 using the common fixing members 34, it is possible to reduce the number of components and to reduce the number of assembling processings of the lamp unit 100.

As described above, in the lamp unit 100 of the present embodiment, it is possible to fix the laser light source 22 of the CAN type package while achieving a good heat radiating property and a high reliability, by pressing the laser light source 22 in a direction toward the pedestal 21 with a pressing member 30 and fixing the pressing member 30 and pedestal 21 to a heat sink 10 by joint fastening with common fixing members 34. Further, since the lamp unit 100 of the present embodiment has a good heat radiating property and is not likely to cause positional deviation of the laser light source 22 due to vibration or heat, the lamp unit 100 may be appropriately used as a light source of a vehicle lamp.

Second Embodiment

Figure 5:
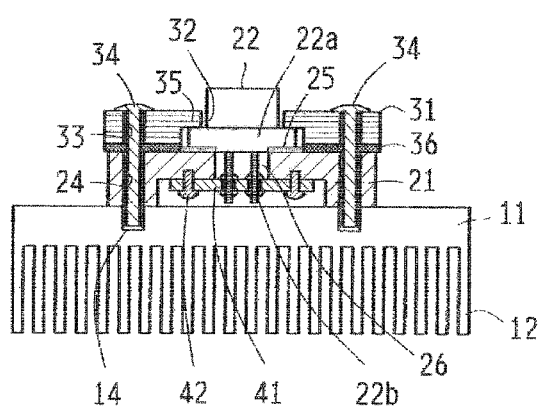
FIG. 5 is a cross-sectional view schematically illustrating a structure of a lamp unit 110 of a second embodiment.

Next, a second embodiment of the present disclosure will be described with reference to FIG. 5. Descriptions of contents overlapped with the first embodiment will be omitted. FIG. 5 is a cross-sectional view schematically illustrating a structure of a lamp unit 110 of the present embodiment. The present embodiment is different from the first embodiment in that a heat conducting member 36 is sandwiched between the pedestal 21 and the pressing member 30.

As illustrated in FIG. 5, in the lamp unit 110, the heat conducting member 36 is interposed in a gap present between the upper surface of the pedestal 21 and the back surface of the flat plate portion 31, so that the heat conducting member 36 is sandwiched by the pedestal 21 and the flat plate portion 31. The heat conducting member 36 is made of a material having a good thermal conductivity, and has a form of, for example, a sheet shape or a paste shape. A specific example of the heat conducting member 36 may include, for example, a heat conducting sheet in which a heat conductive filler is dispersed in a resin, and heat conducting grease.

In the present disclosure, the heat conducting member 36 is sandwiched by the pedestal 21 and the pressing member 30. Thus, heat is satisfactorily conducted from the pedestal 21 to the flat plate portion 31 in a region where the heat conducting member 36 is brought into contact with the pedestal 21 and the flat plate portion 31. Thus, the region brought into contact with the heat conducting member 36 of the flat plate portion 31 corresponds to the heat radiating portion in the present disclosure.

In the present embodiment, in addition to the second heat radiating path described in the first embodiment, a path that passes from the upper surface of the flange portion 22a of the laser light source 22 via the opening peripheral portion 35, and reaches the heat sink body 11 through the flat plate portion 31 and the heat conducting member 36, functions as a third heat radiating path. Therefore, it is possible to transmit and radiate the heat generated by the light emitting of the laser light source 22 more satisfactorily.

As described above, the lamp unit in the present embodiment includes the pressing member 30 which has a heat radiating portion that transmits to the pedestal 21, and the heat conducting member is sandwiched between the heat radiating portion and the pedestal 21, thereby the heat radiating property may be further improved.

Third Embodiment

Figure 6:
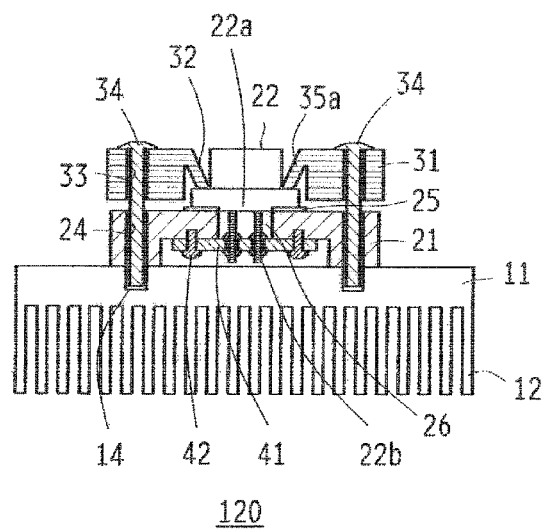
FIG. 6 is a cross-sectional view schematically illustrating a structure of a lamp unit 120 of a third embodiment.

Next, a third embodiment of the present disclosure will be described with reference to FIG. 6. Descriptions of contents overlapped with the first embodiment will be omitted. FIG. 6 is a cross-sectional view schematically illustrating a structure of a lamp unit 120 of the present embodiment. The present embodiment is different from the first embodiment in that the thickness of the pressing member 30 is formed to be large, and an elastic portion 35a is formed in the peripheral portion of the light source exposure opening portion 32.

As illustrated in FIG. 6, in the lamp unit 120, the flat plate portion 31 of the pressing member 30 is formed to be thick, and the elastic portion 35a having an elastically deformable structure is formed in the periphery of the light source exposure opening portion 32. Further, the elastic portion 35a abuts onto the upper surface of the flange portion 22a of the laser light source 22 in the same manner as in the first embodiment. The elastic portion 35a is a portion in which the periphery of the light source exposure opening portion 32 of the flat plate portion 31 is processed, and has a structure similar to a known elastic component. A specific shape of the elastic portion 35a may include, for example, a leaf spring or a belleville spring.

Also in the lamp unit 120, the laser light source 22 is fixed to the pedestal 21 with the adhesive 25, and at the same time, the elastic portion 35a abuts onto flange portion 22a. The pressing member 30 and the pedestal 21 are fastened together to the heat sink 10 by joint fastening with the fixing members 34. Thus, the elastic portion 35a is pressed in a direction toward the heat sink 10 by fastening the fixing members 34, and the flange portion 22a is pressed in a direction toward the heat sink 10 by elastic deformation of the elastic portion 35a.

Therefore, in the lamp unit 120 of the present embodiment, the laser light source 22 is fixed to the pedestal 21 not only by fixing with the adhesive 25, but also by pressing by the elastic portion 35a. As a result, in a case where the adhesive 25 is deteriorated by vibration or heat, it is possible to suppress the optical axis from being shifted with respect to the optical system due to the generation of the positional deviation of the laser light source 22, thereby suppressing the generation of glare.

Fourth Embodiment

Figure 7:
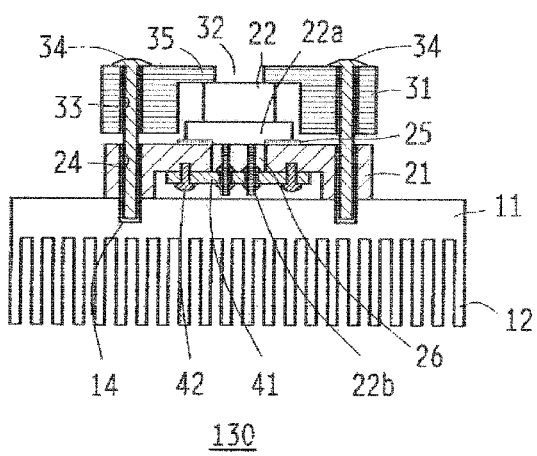
FIG. 7 is a cross-sectional view schematically illustrating a structure of a lamp unit 130 of a fourth embodiment.

Next, a fourth embodiment of the present disclosure will be described with reference to FIG. 7. Descriptions of contents overlapped with the first embodiment will be omitted. FIG. 7 is a cross-sectional view schematically illustrating a structure of a lamp unit 130 of the present embodiment. The present embodiment is different from the first embodiment in that the thickness of the pressing member 30 is formed to be large, and the opening peripheral portion 35 is brought into contact in the vicinity of the upper surface of the light emitting portion of the laser light source 22.

As illustrated in FIG. 7, in the lamp unit 130, the flat plate portion 31 of the pressing member 30 is formed to be thick, an opening diameter of the light source exposure opening portion 32 is smaller than a diameter of the cylindrical member, and the back surface of the opening peripheral portion 35 abuts onto the upper surface of the cylindrical member of the laser light source 22. Also in the present embodiment, the light emitting portion of the CAN type package is exposed within the light source exposure opening portion 32, and light is taken out from the light source exposure opening portion 32. In the present embodiment, since the opening peripheral portion 35 and the upper surface of the cylindrical member are in contact with each other, the vicinity of the light emitting portion of the CAN type package corresponds to an abutting portion in the present disclosure. Here, the vicinity of the light emitting portion is a range within, for example, about 10 mm from the light emitting portion, and may be a range within about 1 to 5 mm from the light emitting portion.

Also in the lamp unit 130, the laser light source 22 is fixed to the pedestal 21 with the adhesive 25, and at the same time, the opening peripheral portion 35 abuts onto the vicinity of the light emitting portion. The pressing member 30 and the pedestal 21 are fastened together to the heat sink 10 by joint fastening with the fixing members 34. Thus, the opening peripheral portion 35 and the vicinity of the light emitting portion are pressed in a direction toward the heat sink 10 by fastening with the fixing members 34.

Therefore, in the lamp unit 130 of the present embodiment, the laser light source 22 is fixed to the pedestal 21 not only by fixing with the adhesive 25, but also by pressing by the pressing member 30. As a result, in a case where the adhesive 25 is deteriorated by vibration or heat, it is possible to suppress the optical axis from being shifted with respect to the optical system due to the generation of the positional deviation of the laser light source 22, thereby suppressing the generation of glare.

Further, a path that passes from the upper surface of the cylindrical portion of the laser light source 22 via the opening peripheral portion 35, and reaches the heat sink body 11 via the flat plate portion 31, the fixing members 34, and the fixing holes 14 is a fourth heat radiating path. As a result, in the lamp unit 130 in the present embodiment, since the opening peripheral portion 35 is brought into contact with the vicinity of the light emitting portion which is an abutting portion, the heat radiating property from the laser light source 22 may be improved by adding the fourth heat radiating path described above.

Fifth Embodiment

Figure 8:
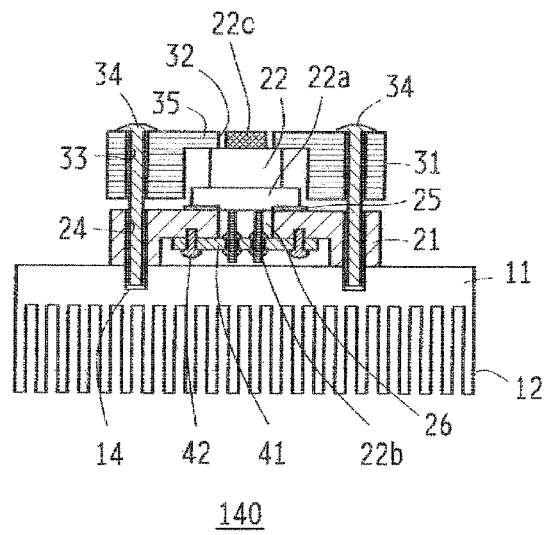
FIG. 8 is a cross-sectional view schematically illustrating a structure of a lamp unit 140 of a fifth embodiment.

Next, a fifth embodiment of the present disclosure will be described with reference to FIG. 8. Descriptions of contents overlapped with the first embodiment will be omitted. FIG. 8 is a cross-sectional view schematically illustrating a structure of a lamp unit 140 of the present embodiment. The present embodiment is different from the fourth embodiment in that a wavelength converting member 22c is provided on the light emitting portion of the laser light source 22.

As illustrated in FIG. 8, in the lamp unit 140, the flat plate portion 31 of the pressing member 30 is formed to be thick, and an opening diameter of the light source exposure opening portion 32 is smaller than a diameter of the cylindrical member of the laser light source 22. Further, the wavelength converting member 22c is disposed on the light emitting portion, and the back surface of the opening peripheral portion 35 abuts onto the upper surface of the cylindrical member of the laser light source 22 in the vicinity of the wavelength converting member 22c. Here, the vicinity of the wavelength converting member 22c is a range within, for example, about 10 mm from the wavelength converting member 22c. In the present embodiment, since the opening peripheral portion 35 and the vicinity of the wavelength converting member 22c are in contact with each other, the vicinity of the wavelength converting member 22c corresponds to an abutting portion in the present disclosure.

The wavelength converting member 22c is a member that converts the wavelength of the first light emitted from the laser light source and emits a second light, and is configured to irradiate the white light due to mixture color of the first light and the second light to the outside of the lamp unit 140. Specific configurations of the wavelength converting member 22c are not limited, and may include, for example, a material in which a fluorescent material is dispersed in resin or glass, or a fluorescent ceramic obtained by sintering a phosphor material. Further, methods of wavelength converting using a fluorescent material are also not limited, and may be a method, for example, that converts the wavelength of blue light into the wavelength of yellow light, or that converts the wavelength of ultraviolet light into wavelength of each of RGB color. Further, specific fluorescent materials are not limited, and may be organic materials or inorganic materials. Known materials such as YAG-based fluorescent materials or Cl_MS fluorescent materials may be used.

In the lamp unit 140, the vicinity of the wavelength converting member 22c corresponds to an abutting portion and a path that passes from the vicinity of the wavelength converting member 22c via the opening peripheral portion 35, and reaches the heat sink body 11 via the flat plate portion 31, the fixing members 34, and the fixing holes 14 is a fifth heat radiating path. Therefore, heat generated by converting of the wavelength of the first light by the wavelength converting member 22c is satisfactorily transmitted from the vicinity of the wavelength converting member 22c to the heat sink 10, and satisfactorily radiated.

As a result, in the lamp unit 140 in the present embodiment, since the opening peripheral portion 35 is brought into contact with the vicinity of the wavelength converting member 22c which is an abutting portion, deterioration of a wavelength converting efficiency may be suppressed by adding the fifth heat radiating path described above to improve the heat radiating property from the wavelength converting member 22c and suppress a temperature rise.

Sixth Embodiment

Figure 9:
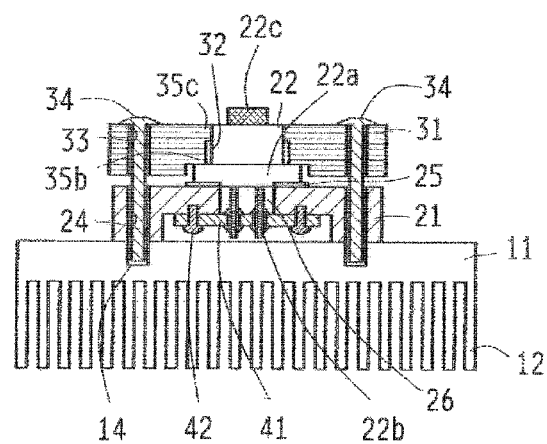
FIG. 9 is a cross-sectional view schematically illustrating a structure of a lamp unit 150 of a sixth embodiment.
Figure 10:
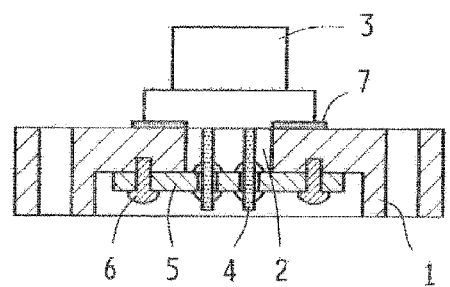
FIG. 10 is a cross-sectional view schematically illustrating a structure of a vehicle lamp using a CAN type package in the related art.

Next, a sixth embodiment of the present disclosure will be described with reference to FIG. 9. Descriptions of contents overlapped with the first embodiment will be omitted. FIG. 9 is a cross-sectional view schematically illustrating a structure of a lamp unit 150 of the present embodiment. The present embodiment is different from the fifth embodiment in that the thickness of the flat plate portion 31 is formed to be large, and at the same time, a flange abutting portion 35b and the side contacting portion 35c are formed.

As illustrated in FIG. 9, in the lamp unit 150, the flat plate portion 31 of the pressing member 30 is formed to be thick, and the flange abutting portion 35b and the side contacting portion 35c are formed with different diameters on the peripheral portion of the light source exposure opening portion 32 with.

The flange abutting portion 35b has a diameter such that the cylindrical portion of the laser light source 22 may be inserted, but the flange portion 22a is not able to be inserted. Further, the flange abutting portion 35b is brought into contact with the upper surface of the flange portion 22a of the laser light source 22. Here, the flange portion 22a that is brought into contact with the flange abutting portion 35b corresponds to an abutting portion in the present disclosure.

The side contacting portion 35c has such a diameter that is substantially the same as that of the cylindrical portion of the laser light source, and is brought into contact with the side of the cylindrical portion in the vicinity of the tip of the laser light source 22. Here, the vicinity of the tip is a range within, for example, about 10 mm from the tip of the laser light source 22. Further, the vicinity of the tip of the laser light source 22 may be the vicinity of the wavelength converting member 22c.

Also in the lamp unit 150, the laser light source 22 is fixed to the pedestal 21 with the adhesive 25, and at the same time, the flange abutting portion 35b is brought into contact with the flange portion 22a. The pressing member 30 and the pedestal 21 are fastened together to the heat sink 10 by joint fastening with the fixing members 34. Thus, the flange abutting portion 35b and the flange portion 22a are pressed in a direction toward the heat sink 10 by fastening the fixing members 34.

Therefore, in the lamp unit 150 of the present embodiment, the laser light source 22 is fixed to the pedestal 21 not only by fixing with the adhesive 25, but also by pressing by the pressing member 30. As a result, in a case where the adhesive 25 is deteriorated by vibration or heat, it is possible to suppress the optical axis from being shifted with respect to the optical system due to the generation of the positional deviation of the laser light source 22, thereby suppressing the generation of glare.

Further, a path that passes from the vicinity of the tip of the cylindrical portion of the laser light source 22 via the side contacting portion 35c, and reaches the heat sink body 11 via the flat plate portion 31, the fixing members 34, and the fixing holes 14 is a sixth heat radiating path. As a result, in the lamp unit 150 in the present embodiment, since the side contacting portion 35c is brought into contact with the vicinity of the tip of the cylindrical portion of the laser light source 22, the heat radiating property from the laser light source 22 may be improved by adding the sixth heat radiating path described above. Further, the heat radiating property from the wavelength converting member 22c is improved and the temperature rise is suppressed, thereby the deterioration of the wavelength converting efficiency may be suppressed.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:
1. A vehicle lamp comprising:
a laser light source having a CAN type package;
a heat sink having radiating fins configured to radiate heat;
a pedestal having a back surface in contact with the heat sink and a front surface opposite the back surface on which the laser light source is mounted;

a pressing plate that abuts onto an abutting portion of the laser light source and presses the laser light source in a direction toward the pedestal, the pressing plate having a heat radiating portion that transmits heat to the pedestal; and a heat conductor sandwiched between the pressing plate and the pedestal, wherein the pressing plate and the pedestal are fixed to the heat sink by a fastener, and wherein an entirety of the pedestal is positioned above heat sink.

2. The vehicle lamp of claim 1, wherein the laser light source includes a wavelength converter, and the pressing plate is brought into contact with the laser light source in the vicinity of the wavelength converter.

3. The vehicle lamp of claim 1, wherein the abutting portion is a flange in the CAN type package.

4. The vehicle lamp of claim 3, wherein the laser light source includes a wavelength converter, and the pressing plate is brought into contact with the laser light source in the vicinity of the wavelength converter.

5. The vehicle lamp of claim 1, wherein the pressing plate is made of a material having a thermal conductivity of 150 to 410 W/m·K.

6. The vehicle lamp of claim 5, wherein the laser light source includes a wavelength converter, and the pressing plate is brought into contact with the laser light source in the vicinity of the wavelength converter.

7. The vehicle lamp of claim 5, wherein the abutting portion is a flange in the CAN type package.

8. The vehicle lamp of claim 7, wherein the laser light source includes a wavelength converter, and the pressing plate is brought into contact with the laser light source in the vicinity of the wavelength converter.

* * * * *